(12) United States Patent
Tel et al.

(10) Patent No.: US 11,709,432 B2
(45) Date of Patent: Jul. 25, 2023

(54) METHOD TO CHARACTERIZE POST-PROCESSING DATA IN TERMS OF INDIVIDUAL CONTRIBUTIONS FROM PROCESSING STATIONS

(71) Applicant: ASML NETHERLANDS B.V., Veldhoven (NL)

(72) Inventors: Wim Tjibbo Tel, Helmond (NL); Ekaterina Mikhailovna Viatkina, Eindhoven (NL); Tom Van Hemert, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 137 days.

(21) Appl. No.: 17/283,307

(22) PCT Filed: Sep. 19, 2019

(86) PCT No.: PCT/EP2019/075215
§ 371 (c)(1),
(2) Date: Apr. 7, 2021

(87) PCT Pub. No.: WO2020/088842
PCT Pub. Date: May 7, 2020

(65) Prior Publication Data
US 2021/0389683 A1    Dec. 16, 2021

(30) Foreign Application Priority Data

Nov. 2, 2018  (EP) .................................... 18204129

(51) Int. Cl.
*G03F 7/20*    (2006.01)
*G03F 7/00*    (2006.01)
*G05B 15/02*   (2006.01)

(52) U.S. Cl.
CPC ...... *G03F 7/70508* (2013.01); *G03F 7/70525* (2013.01); *G03F 7/70616* (2013.01); *G05B 15/02* (2013.01)

(58) Field of Classification Search
CPC ............. G03F 7/70508; G03F 7/70525; G03F 7/70616; G05B 15/02
See application file for complete search history.

(56) References Cited

U.S. PATENT DOCUMENTS 6,952,253 B2   10/2005  Lof et al.
2004/0185583 A1*  9/2004  Tomoyasu ........ H01L 21/67207
                                              700/121
(Continued)

FOREIGN PATENT DOCUMENTS

EP          3290911        3/2018
KR    10-2018-0066147      6/2018
(Continued)

OTHER PUBLICATIONS

Hong-Goo, L. et al.: "Reduction of in-lot overlay variation with integrated metrology, and a holistic control strategy," Proc. of SPIE, vol. 9635 (Oct. 23, 2015).
(Continued)

*Primary Examiner* — Nghia M Doan
(74) *Attorney, Agent, or Firm* — Pillsbury Winthrop Shaw Pittman, LLP

(57) ABSTRACT

A method for characterizing post-processing data in terms of individual contributions from processing stations, the post-processing data relating to a manufacturing process for manufacturing integrated circuits on a plurality of substrates using a corresponding processing apparatus for each of a plurality of process steps, at least some of the processing apparatuses each including a plurality of the processing stations, and wherein the combination of processing stations used to process each substrate defines a process thread for (Continued)

the substrate; the method including: obtaining post-processing data associated with processing of the plurality of substrates in a cyclic sequence of processing threads; and determining an individual contribution of a particular processing station by comparing a subset of the post-processing data corresponding to substrates having shared process sub-threads, wherein a process sub-thread describes the process steps of each process thread other than the process step to which the particular processing station corresponds.

20 Claims, 7 Drawing Sheets

(56) References Cited

U.S. PATENT DOCUMENTS

2018/0307216 A1* 10/2018 Ypma ............... G03F 7/70508
2019/0196334 A1    6/2019 Tel et al.

FOREIGN PATENT DOCUMENTS

| TW | 201723707 | 7/2017 |
| TW | 201812443 | 4/2018 |
| WO | 2017060080 | 4/2017 |
| WO | 2017067748 | 4/2017 |
| WO | 2017144343 | 8/2017 |
| WO | 2018077651 | 5/2018 |

OTHER PUBLICATIONS

Overcast, M. et al.: "Understanding overlay signatures using machine learning on non-lithography context information," Proc. of SPIE, vol. 10585 (Mar. 13, 2018).

Cekli, H.E. et al.: "A novel patterning control strategy based on real-time fingerprint recognition and adaptive wafer level scanner optimization," Proc. of SPIE, vol. 10585 (Mar. 13, 2018).

International Search Report and Written Opinion issued in corresponding PCT Patent Application No. PCT/EP2019/075215, dated Oct. 22, 2019.

Office Action issued in corresponding Korean Application No. 10-2021-7013298, dated Jan. 3, 2023.

* cited by examiner

|   | W1 | W2 | W3 | W4 | W5 | W6 | W7 | W8 | W9 | W10 | W11 | W12 | W13 | W14 | W15 | W16 | W17 | W18 | W19 | W20 |
|---|----|----|----|----|----|----|----|----|----|-----|-----|-----|-----|-----|-----|-----|-----|-----|-----|-----|
| a) | S1 | S2 | S1 | S2 | S1 | S2 | S1 | S2 | S1 | S2 | S1 | S2 | S1 | S2 | S1 | S2 | S1 | S2 | S1 | S2 |
| b) | C1 | C2 | C3 | C1 | C2 | C3 | C1 | C2 | C3 | C1 | C2 | C3 | C1 | C2 | C3 | C1 | C2 | C3 | C1 | C2 |
| c) | C1 | C2 | C1 | C2 | C1 | C2 | C1 | C2 | C1 | C2 | C1 | C2 | C1 | C2 | C1 | C2 | C1 | C2 | C1 | C2 |
| d) | C1 | C2 | C1 | C2 | C1 | C2 | C1 | C2 | C1 | C2 | C1 | C2 | C1 | C2 | C1 | C2 | C1 | C2 | C1 | C2 |
| e) | C1 | C2 | C3 | C4 | C1 | C2 | C3 | C4 | C1 | C2 | C3 | C4 | C1 | C2 | C3 | C4 | C1 | C2 | C3 | C4 |

Fig. 4

| | L1 | L2 | L3 | L4 | L5 | L6 | L7 | L8 | L9 | L10 | L11 | L12 | L13 | L14 | L15 | L16 | L17 | L18 | L19 | L20 |
|---|---|---|---|---|---|---|---|---|---|---|---|---|---|---|---|---|---|---|---|---|
| a) | a)T3 | a)T2 | a)T3 | a)T5 | a)T4 | a)T2 | a)T1 | a)T5 | a)T4 | a)T2 | a)T3 | a)T1 | a)T4 | a)T3 | a)T3 | a)T3 | a)T2 | a)T5 | a)T1 | a)T2 |
| b) | b)T1 | b)T4 | b)T3 | b)T6 | b)T2 | b)T5 | b)T2 | b)T4 | b)T3 | b)T1 | b)T6 | b)T5 | b)T4 | b)T3 | b)T2 | b)T4 | b)T1 | b)T6 | b)T5 | b)T2 |
| c) | a)T3 | c)T2 | c)T5 | c)T4 | c)T1 | c)T1 | c)T1 | c)T5 | c)T4 | c)T2 | c)T4 | c)T2 | c)T5 | c)T5 | c)T5 | c)T4 | c)T1 | c)T2 | c)T5 | c)T2 |
| d) | d)T2 | d)T3 | d)T1 | d)T5 | d)T1 | d)T2 | d)T4 | d)T5 | d)T2 | d)T1 | d)T5 | d)T4 | d)T3 | d)T1 | d)T1 | d)T5 | d)T3 | d)T2 | d)T1 | d)T4 |
| e) | e)T1 | e)T4 | e)T3 | e)T2 | e)T1 | e)T3 | e)T1 | e)T4 | e)T2 | e)T4 | e)T2 | e)T1 | e)T4 | e)T2 | e)T3 | e)T1 | e)T3 | e)T2 | e)T1 | e)T3 |

Fig. 8

METHOD TO CHARACTERIZE POST-PROCESSING DATA IN TERMS OF INDIVIDUAL CONTRIBUTIONS FROM PROCESSING STATIONS

CROSS-REFERENCE TO RELATED APPLICATIONS

This application is the U.S. national phase entry of PCT Patent Application No. PCT/EP2019/075215 which was filed on Sep. 19, 2019, which claims the benefit of priority of European Patent Application No. 18204129.3 which was filed on Nov. 2, 2018 and which is incorporated herein in its entirety by reference.

FIELD

The present disclosure relates to processing of substrates for the production of, for example, semiconductor devices.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use radiation. The wavelength of this radiation determines the minimum size of features which can be formed on the substrate. Typical wavelengths currently in use are about 365 nm (i-line), about 248 nm, about 193 nm and about 13 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of about 193 nm.

Low-k1 lithography may be used to process features with dimensions smaller than the classical resolution limit of a lithographic apparatus. In such a process, the resolution formula may be expressed as $CD=k_1\times\lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of a numerical aperture (NA,) a customized illumination scheme, use of one or more phase shifting patterning devices, optimization of the design layout such as optical proximity correction (OPC) in the design layout, or other methods generally defined as resolution enhancement techniques (RET). Additionally or alternatively, one or more tight control loops for controlling a stability of the lithographic apparatus may be used to improve reproduction of the pattern at low k1.

Effectiveness of the control of a lithographic apparatus may depend on characteristics of individual substrates. For example, a first substrate processed by a first processing tool prior to processing by the lithographic apparatus (or any other process step of the manufacturing process, herein referred to generically as a manufacturing process step) may benefit from (slightly) different control parameters than a second substrate processed by a second processing tool prior to processing by the lithographic apparatus.

Typically for substrates, pre-processing data is available (data associated with manufacturing process steps performed before a certain manufacturing process step of interest) and post-processing data (data associated with measurements performed on substrates after having been subject to the manufacturing process step of interest). It is desirable, for example, to control the manufacturing process of interest based on knowledge of the pre-processing data, as this allows the control loop to anticipate an expected post-processing result. However, this control typically involves knowledge of the relation between pre-processing information and post-processing information and how control parameters of the process of interest affect the post-processing data. It may not always be known how control settings of the process of interest affect post-processing data. For example, an applied dose setting within a lithographic process may have a predictable effect on a certain critical dimension associated with a feature obtained after performing the lithographic process, or it may not. More problematic can be poor performance of methods to predict post-processing data based on, often very large amounts of, pre-processing data. Often the pre-processing data comprises too many parameters to allow the construction of a reliable model linking pre-processing data to post-processing data.

Machine learning techniques may be utilized to recognize patterns of cause-and-effect between processing context observed impact on one or more characteristics (such as overlay, CD, edge placement error (EPE), etc.) of substrates being subject to a process. These patterns can then be used to predict and correct errors in processing subsequent substrates. Some examples of such systems are described in PCT patent application publication no. WO 2017/060080. In a few cases the pre-processing data has a limited set of associated parameters. For example, when only an identification (ID) of an etch chamber is used as the pre-processing data associated with to-be-processed substrates, it may be straightforward to establish a relation between post-processing data (e.g., an overlay fingerprint) and a value of the parameter comprised within the pre-processing or context data; for example by decomposing the overlay fingerprint to determine the contribution of the particular etch chamber used. However, in more complicated manufacturing processes (e.g., multiple patterning processes), the total process to produce a single layer may comprise multiple exposure and etch steps, with each step being potentially performed on one of a number of processing stations (stages or chambers) on one of a number of apparatuses. As such, the number of potential combinations of process tools and processing stations that each substrate is subject to can increase to the point where such a fingerprint decomposition is not feasible due to the metrology effort required.

SUMMARY

In a first aspect of the invention there is provided a method for characterizing post-processing data in terms of individual contributions from processing stations, the post-processing data relating to a manufacturing process for manufacturing integrated circuits on a plurality of substrates using a corresponding processing apparatus for each of a plurality of process steps, at least some of said processing apparatuses each comprising a plurality of said processing stations, and wherein the combination of processing stations used to process each substrate defines a process thread for said substrate; the method comprising: obtaining post-processing data associated with processing of the plurality of substrates in a cyclic sequence of processing threads; and determining an individual contribution of a particular processing station by comparing a subset of the post-processing data corresponding to substrates having shared process sub-threads, wherein a process sub-thread describes the process steps of each process thread other than the process step to which the particular processing station corresponds.

In a second aspect of the invention there is provided a method for characterizing post-processing data in terms of individual contributions from processing stations, the post-processing data relating to a manufacturing process for manufacturing integrated circuits on a plurality of substrates in a plurality of process steps using one or more processing apparatuses, at least some of said processing apparatuses each comprising a plurality of said processing stations, said method comprising: characterizing, in a first stage, only a subset of said post-processing data in terms of individual contributions from processing stations comprised within a proper subset of processing apparatuses, wherein said subset of said post-processing data relates to the manufacturing process performed on a proper subset of said plurality of substrates using the proper subset of the one or more processing apparatuses.

In a further aspect of the invention, there is provided a computer program comprising program instructions operable to perform the method of the first and/or second aspect when run on a suitable apparatus.

BRIEF DESCRIPTION OF THE DRAWINGS

Embodiments of the invention will now be described, by way of example only, with reference to the accompanying schematic drawings, in which:

FIG. 4 depicts a table of the processing stations used to process each wafer of a group of wafers (e.g., forming part of a single lot) over a number of processing steps;

FIG. 8 depicts a table of the processing apparatuses used to process each lot of wafers, of a plurality of wafer lots, over a number of processing steps.

DETAILED DESCRIPTION

Figure 1:
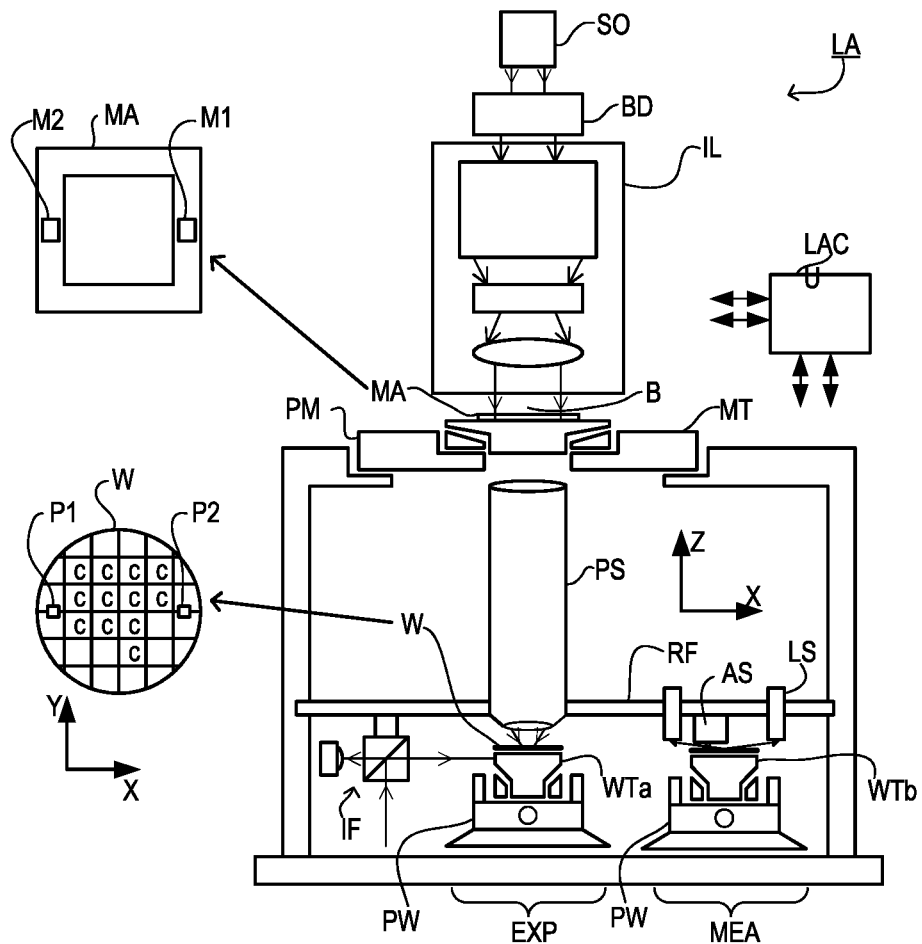
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a support (e.g., a mask table) T constructed to support a patterning device (e.g., a mask) MA and connected to a first positioner PM configured to accurately position the patterning device MA in accordance with certain parameters, one or more substrate supports (e.g., a wafer table) WTa and WTb constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

Lithographic apparatus LA in this example is of a so-called dual stage type which has two substrate tables WTa and WTb and two stations—an exposure station and a measurement station—between which the substrate tables can be moved. While one substrate on one substrate table is being exposed at the exposure station EXP, another substrate can be loaded onto the other substrate table at, e.g., the measurement station MEA or at another location (not shown) or can be processed at measurement station MEA. A substrate table with a substrate can be located at measurement station MEA so that various preparatory steps may be carried out. The preparatory steps may include mapping the surface height of the substrate using a level sensor LS and/or measuring the position of alignment marks on the substrate using an alignment sensor AS. The alignment marks are arranged nominally in a regular grid pattern. However, due to inaccuracies in creating the marks and also due to deformations of the substrate that occur throughout its processing, the marks may deviate from the ideal grid.

Consequently, in addition to measuring position and orientation of the substrate, the alignment sensor in practice may measure in detail the positions of many marks across the substrate area, if the apparatus LA is to print product features at the correct locations with high accuracy. The measurement of alignment marks can therefore be time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. An embodiment of the invention can be applied in an apparatus with only one substrate table, or with more than two.

In addition to having one or more substrate supports, the lithographic apparatus LA may comprise a measurement stage (not shown). The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The apparatus further includes a lithographic apparatus control unit LACU which controls all the movements and measurements of various actuators and sensors of the lithographic apparatus (such as those described). Control unit LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
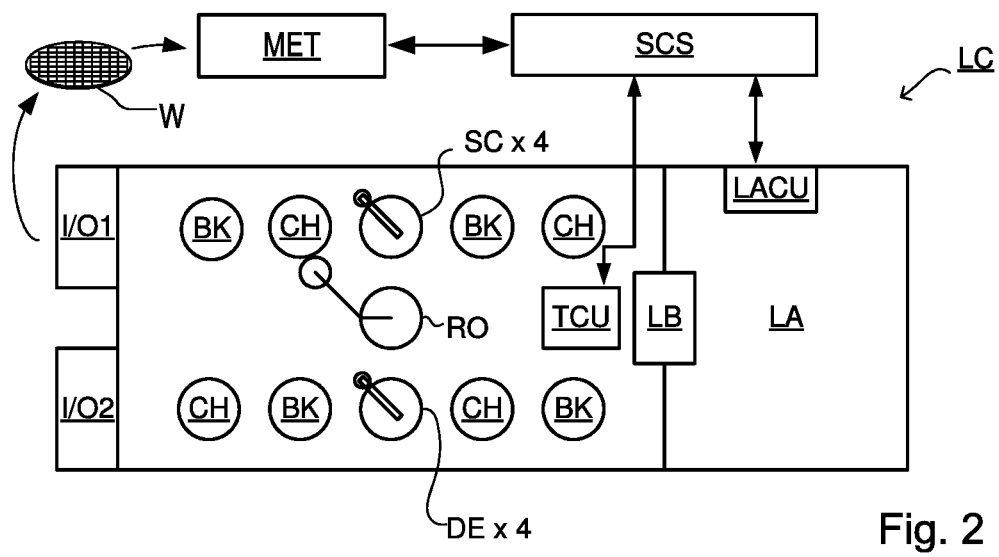
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatuses to perform pre- and post-exposure processes on a substrate W. Conventionally these apparatuses includes one or more spin coaters SC to deposit resist layers, one or more developers DE to develop exposed resist, one or more chill plates CH and one or more bake plates BK, e.g. for conditioning the temperature of substrates W e.g. for conditioning solvents in the resist layers. A substrate handler, or robot, RO picks up substrates W from input/output ports I/O1, I/O2, moves them between the different processing apparatuses and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, one or more inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus MET, which may also be referred to as a metrology apparatus or metrology tool, is used to determine one or more properties of the substrates W, and in particular, how one or more properties of different substrates W vary or how one or more properties associated with different layers of the same substrate W vary from layer to layer. The inspection apparatus may be constructed to identify defects on the substrate W and may, for example, be part of the lithocell LC, or may be integrated into the lithographic apparatus LA, or may even be a stand-alone device. The inspection apparatus may measure the one or more properties on a latent image (an image in a resist layer after the exposure), or on a semi-latent image (an image in a resist layer after a post-exposure bake step), or on a developed resist image (in which the exposed or unexposed parts of the resist have been removed), or even on an etched image (after a pattern transfer step such as etching).

Figure 3:
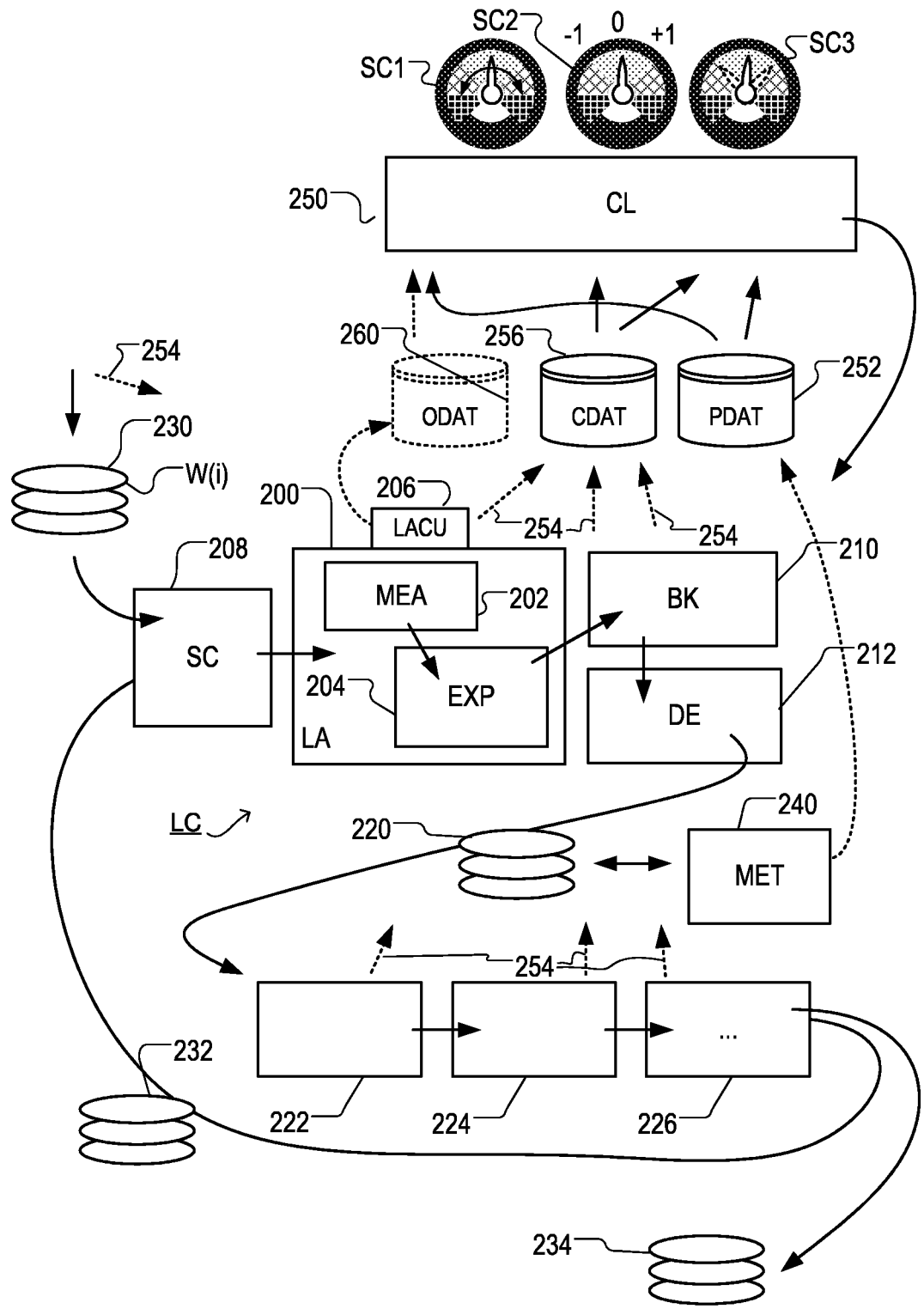
FIG. 3 shows schematically the use of the lithographic apparatus and lithographic cell of FIGS. 1 and 2 together with one or more other apparatuses forming a manufacturing facility for, e.g., semiconductor devices, the facility including a control apparatus implementing manufacturing optimization technology.

FIG. 3 shows the lithographic apparatus LA and the lithocell LC in the context of an industrial manufacturing facility for, e.g., semiconductor products. Within the lithographic apparatus (or "litho tool" 200 for short), the measurement station MEA is shown at 202 and the exposure station EXP is shown at 204. The control unit LACU is shown at 206. As already described, litho tool 200 forms part of a "litho cell" or "litho cluster" that also includes a coating apparatus SC, 208 for applying photosensitive resist and/or one or more other coatings to substrate W for patterning by the apparatus 200. At the output side of apparatus 200, a baking apparatus BK, 210 and developing apparatus DE, 212 are provided for developing the exposed pattern into a physical resist pattern. Other components shown in FIG. 3 are omitted, for clarity.

Once the pattern has been applied and developed, patterned substrates 220 are transferred to other processing apparatuses such as are illustrated at 222, 224, 226. A wide range of processing steps are implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

The described semiconductor manufacturing process comprising a sequence of patterning process steps is just one example of an industrial process in which the techniques disclosed herein may be applied. The semiconductor manufacturing process includes a series of patterning steps. Each patterning process step includes a patterning operation, for example a lithographic patterning operation, and a number of other chemical and/or physical operations.

The manufacture of semiconductor devices involves many repetitions of such processing, to build up device structures with appropriate materials and patterns, layer-by-layer on the substrate. Modern device manufacturing processes may comprise 40 or 50 individual patterning steps, for example. Accordingly, substrates 230 arriving at the litho cluster may be newly prepared substrates, or they may be substrates that have been processed previously in this cluster 232 or in another apparatus entirely. Similarly, depending on the required processing, substrates on leaving apparatus 226 may be returned for a subsequent patterning operation in the same litho cluster (such as substrates 232), they may be destined for patterning operations in a different cluster (such as substrates 234), or they may be finished products to be sent for dicing and packaging (such as substrates 234).

Each layer of the product structure typically involves a different set of process steps, and the apparatuses used at each layer may be completely different in type. Further, even where the processing steps to be applied by the apparatuses are nominally the same, in a large facility, there may be several supposedly identical machines working in parallel to perform the processing on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. Parallel processing may also be performed in different chambers within a larger apparatus. Moreover, in practice, different layers often involve different etch processes, for example chemical etch, plasma etch, etc., according to the details of the material to be etched, and special requirements such as, for example, anisotropic etching.

The previous and/or subsequent processes may be performed in other lithography apparatuses, as just mentioned, and may even be performed in different types of lithography apparatus. For example, one or more layers in the device manufacturing process which are very demanding in terms of, e.g., resolution and/or overlay may be performed in a more advanced lithography tool than one or more other layers that are less demanding. Therefore, one or more layers may be exposed in an immersion type lithography tool, while one or more others are exposed in a 'dry' tool. One or more layers may be exposed in a tool working at DUV wavelengths, while one or more others are exposed using EUV wavelength radiation.

Also shown in FIG. 3 is the metrology apparatus (MET) 240 which is provided for making measurements of parameters of the products at desired stages in the manufacturing process. A common example of a metrology station in a modern lithographic manufacturing facility is a scatterometer, for example an angle-resolved scatterometer or a spectroscopic scatterometer, and it may be applied to measure one or more properties of developed substrates at 220 prior to etching in the apparatus 222. Using metrology apparatus 240, it may be determined, for example, that a performance parameter such as overlay or critical dimension (CD) does not meet specified accuracy requirements in the developed resist. Prior to the etching step, the opportunity exists to strip the developed resist and reprocess one or more of the substrates 220 through the litho cluster. Moreover, the metrology results from the apparatus 240 can be used to maintain accurate performance of the patterning operations in the litho cluster, by making small adjustments over time, thereby reducing or minimizing the risk of products being made out-of-specification, and requiring re-work. Of course, metrology apparatus 240 and/or one or more other metrology apparatuses (not shown) can be applied to measure one or more properties of the processed substrates 232, 234, and/or of incoming substrates 230.

Typically the patterning process in a lithographic apparatus LA is one of the most significant steps in the processing which involves high accuracy of dimensioning and placement of structures on the substrate W. To help ensure this high accuracy, three systems may be combined in a control environment as schematically depicted in FIG. 3. One of these systems is the litho tool 200 which is (virtually) connected to a metrology apparatus 240 (a second system) and to a computer system CL 250 (a third system). A desire of such an environment is to optimize or improve the cooperation between these three systems to enhance an overall so-called "process window" and provide one or more tight control loops to help ensure that the patterning performed by the lithographic apparatus LA stays within a process window. The process window defines a range of values of a plurality of process parameters (e.g. two or more selected from dose, focus, overlay, etc.) within which a specific manufacturing process yields a defined result (e.g. a functional semiconductor device)—typically a range within which the values of the process parameters in the lithographic process or patterning process are allowed to vary while yielding a proper structure (e.g., specified in terms of an acceptable range of CD (such as +−10% of a nominal CD)).

The computer system CL may use (part of) the design layout to be patterned to predict which one or more resolution enhancement techniques to use and to perform computational lithography simulations and calculations to determine which patterning device layout and lithographic apparatus settings achieve a largest overall process window of the patterning process (depicted in FIG. 3 by the double arrow in the first dial SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second dial SC2).

The metrology tool MET may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third dial SC3).

Computer system 250 implements a form of feedback control based on a combination of (i) first data or "pre-processing data" associated with substrates before they are processed in a given processing step (for example a lithography step) and (ii) second data or "post-processing data" that is associated with the substrates after they have been processed. As an example of pre-processing data, computer system 250 has access to context data CDAT. This context data may be data not obtained from the products themselves, but representing all or part of the processing history of individual product units (wafers or other substrates), or batches of product units. As an example of pre-processing data, historic performance data PDAT is illustrated in FIG. 3, which may include for example measurements of overlay and/or CD made by metrology apparatus 240, and context data CDAT associated with individual substrates. Computer system 250 therefore has access to historic performance data PDAT and which is stored in storage 252. Arrows 254 throughout the diagram illustrate how context data may come from any of the apparatuses. Context data may also arrive with the new substrates 230. For example, the context data may record what types of process steps have been applied, which individual apparatuses have been used in the performance of those steps, and what parameters were applied by those apparatuses (for example settings of temperature or pressure while in etching apparatus 222, or parameters such as illumination modes, alignment recipes, etc. in the litho tool 200). The context data is stored in storage 256 for use by the computer system 250.

The performance data PDAT may be regarded as an example of object data used in some embodiments of the techniques disclosed herein. Other examples of pre-processing data may include object data ODAT derived from measurements made (directly or indirectly) on the product units in advance of or during performance of the processing. FIG. 3 shows this object data optionally collected and stored in a database 260. Such object data may be data measured on the product units themselves, or measured on other parts involved in the industrial process. As one example, the object data stored in a database 260 may comprise the alignment data conventionally obtained by the lithographic apparatus 200 using alignment sensor AS in the measurement station 202. As this data representing detailed measurements of positions of marks in the X-Y plane of the substrate is obtained inherently as part of the normal patterning operation, little or no penalty is incurred by instructing the control unit LACU, 206 to store the data in the object data storage 260. Alternatively, or in addition to the alignment data, the object data may include height data obtained using level sensor LS, and/or "wafer quality" signals from the alignment sensor AS or the like. In other embodiments, the object data may include data measured elsewhere in the system, and not on the product units themselves. An example of such object data might be patterning device (mask or reticle) alignment data obtained using the patterning device alignment marks M1, M2 and/or one or more sensors in the one or more substrate supports of the lithographic apparatus of FIG. 1.

The term "object data" as used in in this description may encompass a wide variety of data that may be gathered in the manufacturing facility, either for historic product units, or new product units to be processed. "Object data" as used in herein may encompass both the performance data PDAT (measured from processed product units after processing and stored in storage 252) and the other types of object data ODAT (measured from product units or other systems before and/or during processing and stored in storage 260). Depending on context, this object data may be "pre-processing data" or "post-processing data". Object data collected in advance of a particular processing step, including for example alignment data or height data measured immediately prior to exposure of a substrate, may be regarded as a form of pre-processing data as described herein. The same object data may be regarded as performance data, i.e. post-processing data, with respect to a previous processing step. For example, alignment marks may contain fingerprints of previous etching or polishing steps. Therefore, in some embodiments, a piece of object data may serve as post-processing data (historic performance data) in the control loop of one processing step, and as pre-processing data (similar to the context data) in the control loop of a later processing step.

While FIG. 3 shows separate storage 252, 256, 260 for each of the context data, performance data and other object data, it will be appreciated that these different types of data may be stored in one common storage unit, or may be distributed over a larger number of storage units, from which particular items of data can be retrieved when required. Further, while the context data 254 is shown as emanating from individual apparatuses 222, 224, etc., the data may be collected through a central control system that controls the operation of the lithocell and/or the manufacturing plant as a whole.

Each record in the object data, context data and performance data storage is labeled with a unique identifier. Noting that an individual substrate might pass repeatedly through the same litho tool in the course of a manufacturing process, or might pass through different tools all measuring the same marks, it is possible to collect data for the same product unit at different stages of the manufacturing process. Each of these instances of measurement can be treated in the analysis as an independent product unit. In the case where there are multiple instances of the same substrate being measured at different stages in a complex manufacturing process, however, the object data will include an identifier that uniquely identifies not only the individual substrate, but the stage of processing in which it has been measured. Typically, in a lithographic process, different instances of the same substrate will be associated with patterning successive layers of a device structure.

A relatively new technology area is the domain of machine learning. Methods relating to this technology are nowadays used to improve prediction of process parameters based on recognition of patterns present within the acquired data (measurements and context data). Additionally, machine learning techniques may be useful to guide the user in selecting data that is most useful for process control purposes.

As a (semiconductor) manufacturing process involves multiple processing apparatuses (lithographic apparatus, one or more etching stations, etc.) it may be beneficial to optimize the process as a whole, e.g. take specific correction capabilities associated with individual processing apparatuses into account. This leads to the perspective that control of a first processing apparatus may be (partly) based on one or more known control properties of a second processing apparatus. This strategy is commonly referred to as co-optimization. Examples of such a strategy are the joint optimization of a lithographic apparatus and a density profile of a patterning device and/or a lithographic apparatus and an etching station. More information on co-optimization may be found in PCT Patent Application Publication Nos. WO 2017/067748 and WO 2017/144343, which are incorporated herein in their entireties by reference.

In some process control situations, the control objective may be, for example, "number of dies in spec"—typically being a yield driven process control parameter to obtain a maximum number of functional products (typically a product is associated with a die on a substrate, hence often yield based process control is referred to as based on a "dies in spec" criterion) per batch of processed substrates. To obtain a good yield based process control, a sampling scheme for metrology measurements may benefit from measurements performed at, on or near locations which are expected to be most critical for yield and/or may be statistically most relevant to determine whether yield is affected. Apart from measuring one or more properties of product features also occurrence of defects may be measured to further assist in optimizing the process for optimal yield (reference defect inspection). More information on yield based control may be found in European patent application, no. EP16195819.4, which is incorporated herein in its entirety by reference.

As discussed, context data may be used for purposes of process control. Machine learning techniques may be utilized to recognize patterns in context data and subsequently relate them to an expected impact on one or more characteristics (such as overlay, CD, edge placement error (EPE), etc.) of substrates being subject to a process. Known methods depend on the availability of historic post-processing data, such as overlay data, CD data or yield data as measured on a large set of processed substrates for which also pre-processing (context) data (data associated with substrates prior to undergoing a certain process of interest) is available. To relate these two classes of data typically the post-processing data is clustered based on well-known methods such as k-means and/or PCA analysis. Subsequently, relations between the post-processing data clusters and pre-processing data is established, in order to formulate a model capable of assigning to be processed substrates to a certain expected characteristic of post-processing data, based purely on its associated pre-processing data. Examples of such systems are described in PCT patent application publication no. WO 2017/060080, which is incorporated herein in its entirety by reference.

In a few cases the pre-processing data has a limited set of associated parameters. For example, when only an ID of an etch chamber is recorded to characterize the pre-processing data associated with to-be-processed substrates. In this case it is often straightforward to establish a relation between a cluster of substrates pertaining to a certain cluster of post-processing data and a value of the parameter comprised within the pre-processing data. In an example a certain cluster of substrates associated with a certain class of overlay data (fingerprint) may be assigned to a value of the etch chamber ID, e.g., substrates associated with prior processing by chamber 2 may for example be linked to radial overlay fingerprints while substrates associated with prior processing by chamber 5 may for example be linked to saddle-shaped overlay fingerprints. Hence when it is known that a to-be-processed substrate has passed via etch chamber 5 the process (control) can be adjusted to compensate a saddle shaped overlay fingerprint by applying an adequate overlay correction to the process (for example, to a lithographic process).

In general, however, pre-processing data typically comprises context data relating to many process steps. In a modern semiconductor manufacturing facility (generally referred to as a "fab" or "wafer fab" for short) many processing steps, on many processing apparatuses/tools, may be performed and may potentially be used for context based control purposes. Even for a single layer, the steps may comprise a lithographic exposure (scanner) step followed by a number of different etch steps (e.g., in a double or multiple patterning process, e.g., self-aligned multiple patterning SAMP, there may be four or more separate etch steps). Each of these steps have an associated context value, e.g., a particular table/chuck for the scanner step and/or a different chamber for each of the etch steps, which are typically performed using different etch tools. A fab typically will utilize a plurality of scanners and etch devices for a particular manufacturing process.

A process control method will aim to correct for the impact of these multiple processing apparatuses on performance after etch. In order to do so, final performance parameter fingerprints (e.g., a spatial distribution of values or their residuals for the performance parameter over a substrate/die/field) within the post-processing data are decomposed into individual tool contributions to this fingerprint. Examples of such a performance parameter fingerprint are: overlay fingerprint, CD fingerprint, yield fingerprint, focus fingerprint, and/or EPE fingerprint. Using the example of CD, the final CD fingerprint can be decomposed into a fingerprint caused by deposition, a fingerprint caused by lithography, and a fingerprint caused by each etching step.

The goal of fingerprint decomposition is to determine a fingerprint library. This library in turn is used to compute (estimate) the end-performance fingerprint (and corrections therefor) of each new wafer based on the pre-processing data (and more specifically, context data or context labels) relating to each apparatus station used to process a particular substrate.

Therefore, to implement such a method of decomposing end-performance fingerprints into individual tool contributing fingerprints using present techniques, there has to be a large amount of post processing data, relating to each pre-processing data combination, hereafter referred to as a process thread. A process thread in this context is the particular combination of processing stations within the processing apparatuses, used to process a particular substrate in a manufacturing process (e.g., to form a layer). A processing apparatus may therefore comprise a lithographic apparatus (scanner), etch apparatus, deposition apparatus or any other processing apparatus used in a semiconductor manufacturing process, and a processing station may comprise a sub-station of the processing apparatus (e.g., the chuck/stage of a dual-stage or multi-stage scanner, the etch chamber of an etch apparatus etc.). Therefore, a process thread for a manufacturing process comprising 5 steps a) to e) on a particular substrate, may comprise (purely for example): a) stage 1 of scanner 3, b) chamber 1 of partition etch tool 2, c) chamber 2 of spacer etch tool 1, d) chamber 2 of clean etch tool 4 and e) chamber 1 of final etch tool 3.

It can therefore be appreciated that the number of possible combinations of processing stations for each process thread are great. As such, the amount of substrates which need to be measured to construct a fingerprint library will grow very quickly with the amount of processing steps, number of individual processing apparatuses per processing step, and number of individual processing stations per processing apparatus. For many multiple-step processes, this will increase to a level where present fingerprint decomposition techniques are no longer feasible in practice.

It is therefore proposed to perform a hierarchical fingerprint decomposition based on lots, or other substrate groupings. In particular, the substrates are grouped such that each group of substrates, typically a lot, comprises substrates which will all be processed on the same combination of processing apparatuses within a fab, although not necessarily the same processing stations. While a lot conventionally comprises 25 substrates, the proposed hierarchal decomposition may be based on groups or lots of any number (greater than one, although more than 10, or more than 20 would be more sensible).

The hierarchal fingerprint decomposition can then comprise two stages or hierarchies. In a first stage or intra-lot data stage, an intra-lot (or intra-group) fingerprint decomposition is performed to decompose for differences in intra-lot data resultant from the different processing stations of each processing apparatus (each lot being defined as a group of substrates for which only one particular processing apparatus for each processing step of a manufacturing process is used; i.e., is processed using a single combination of processing apparatuses). The first stage may at first begin by measuring all substrates per lot; however the number of substrates measured per lot may be reduced over time, as will be described later.

A second stage or inter-lot stage can then be performed on inter-lot data (e.g., data averaged per lot) to decompose for differences resultant from the different processing apparatuses used for different lots. This step may comprise averaging the fingerprints over all processing stations within each processing apparatus. Decomposition over lots is now focused on tool-to-tool delta fingerprints, i.e. the number of processing stations per processing apparatus no longer needs to be considered when determining the number of substrates to measure. This substantially reduces the number of substrates which need to be measured.

Another considerable advantage in the proposed method, is that a typical intra-lot process flow will follow a repeating and/or predictable sequence of process threads for the sequence of substrates in each lot. Typically each processing apparatus may have between only two to four processing stations, depending on their function and particular design. Each successive substrate, at each processing step, will be loaded onto the first available processing station; i.e., the stations are used in a staggered manner. This will result in a repeating and predictable sequence in the process threads over the lot. This can be utilized to reduce the number of measurements which need to be performed, compared to the random allocation of chambers assumed in current decomposition algorithms, as without the proposed hierarchal flow, it is not known or predictable as to which apparatus a substrate will be allocated to.

This predictable sequence of processing threads can be exploited in multiple ways; for example:

Metrology sampling can be distributed between substrates where a certain process thread occurs multiple times (context driven distributed sampling); for example, if a lot comprises two or more substrates which have been subject to the same processing thread, a different sampling scheme can be used on each of the two substrates; i.e., per process thread. This will result in a better sampling density (e.g., double the sampling density) per process thread.

Measurement of some substrates may be skipped. For example, it may be that only one substrate per process thread is measured, where more than one substrate has been subject to the same processing thread.

Context labels, in combination with the non-random sequence of process threads, can be used to isolate station-station delta fingerprints for each processing step.

FIG. 4 is a table illustrating processing station allocation in an intra-lot data stage according to an example manufacturing process. Each column W1-W16 represents a substrate of a single lot, while each row represents a particular processing step a) to e). Each entry describes the processing station used to process each substrate at each processing step. The first processing step a) is a lithography step performed on a scanner apparatus with two stages S1, S2. Processing step b)-d) each represent different etch steps. The processing (etching) apparatus used to perform step b) has three chambers C1, C2, C3. The processing apparatus used to perform step c) and the processing apparatus used to perform step d) each have two chambers C1, C2. The processing apparatus used to perform step e) has four chambers C1, C2, C3, C4. Note that some of the (similar) steps may, in fact, be performed on the same processing apparatus. For example, any two or more of the etch steps b) to d) may be performed on the same etch apparatus, such that (for example) etch chamber C2 at step b) may be the same as etch chamber C2 at step e). Where different processing steps are performed on different processing apparatuses then, of course, the processing chambers will not be the same; for example etch chamber C1 at step c) would be a different physical etch chamber in a different etch apparatus than etch chamber C1 at step d).

This table is purely exemplary. Any of the number of process steps, their types, the number of processing stations per processing apparatus, the process threads and their sequencing etc. may vary from the illustration. In the example shown, the substrates are processed 'staggered' (each station that becomes available is used for the next substrate). As such, for each process step, each substrate is cycled through the processing stations sequentially, as illustrated.

The entries in each column describe a process thread (e.g., substrate W1 is processed on the first scanner stage for step a) and the first chamber C1 of each respective apparatus for each of steps b) to e)). It can be seen that the sequence of process threads repeats after substrate W12. Therefore, if all 25 substrates are measured for a typical lot of 25 (in the table only substrates W1 to W20 are explicitly shown, the remaining process threads for the other substrates can be inferred due to the repeating sequence), each process thread will be present in the data set twice (with one present three times); e.g., substrate W1 is subject to the same processing thread as substrate W13 (and substrate W25), substrate W2 is subject to the same processing thread as substrate W14, etc. Of course, the actual sequence and its repetition rate will depend on the number of processing steps and processing stations applicable to a particular process. Additionally a lot may comprise more or fewer than 25 substrates.

Because of this sequence repetition, it is possible to apply two different sampling schemes per processing thread (e.g., measuring substrates W1 and W13 with different sampling schemes). Alternatively, in an embodiment, only 12 substrates total per lot need be measured (one substrate per processing thread); e.g., measure only substrates W1 to W12 (although a better distribution of measurements throughout the lot may be preferred for practical reasons).

Figure 5:
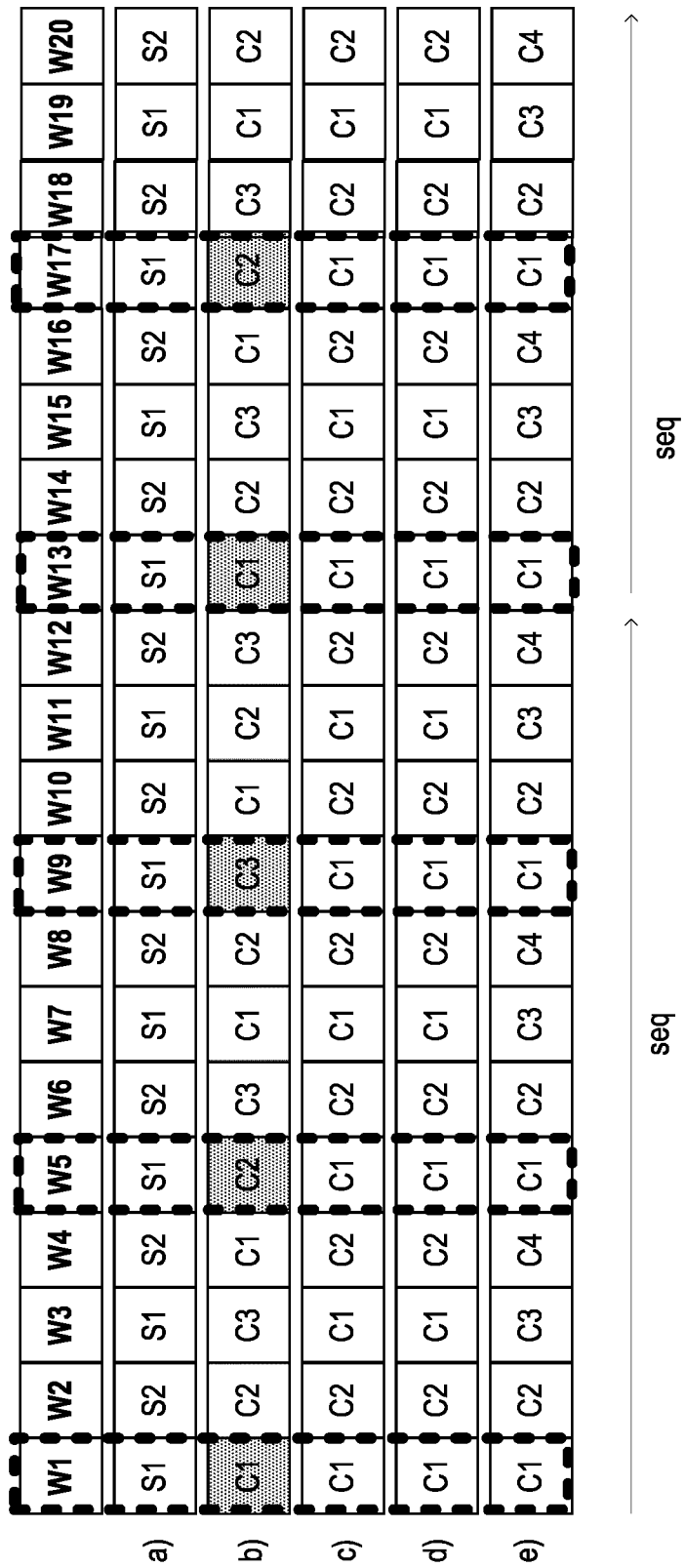
FIG. 5 depicts the table of FIG. 4, highlighting a first method of isolating individual fingerprint contributions from individual processing stations.

FIG. 5 shows the same table as FIG. 4, marked to illustrate how component (contributory) fingerprints applicable to individual processing stations may be isolated. Such a method may comprise identifying sets of substrates within the lot, for which all but one of the steps of the process comprise the same processing stations; i.e., where process comprises n steps, the (part) process thread for n−1 of those steps is the same. The term "process sub-thread" will be used throughout to refer to the identical (shared) portion of two or more processing threads which all differ at only one processing step. In the specific example shown, substrate W1 and every fourth substrate thereafter (i.e., substrates W1, W5, W9, W13, W17, W21, W25), have the same process sub-thread for processing steps a), c), d) and e). Only for processing step b) does the processing station differ between substrates of this set, the substrates cycling sequentially through each processing station. Therefore, the component fingerprints of each of stations C1, C2 and C3 of the apparatus used for step b) can be isolated from the effects of the other apparatuses. It is also apparent the delta fingerprints for each of these stations can be determined (i.e., C1 vs C2 vs C3).

Figure 6:
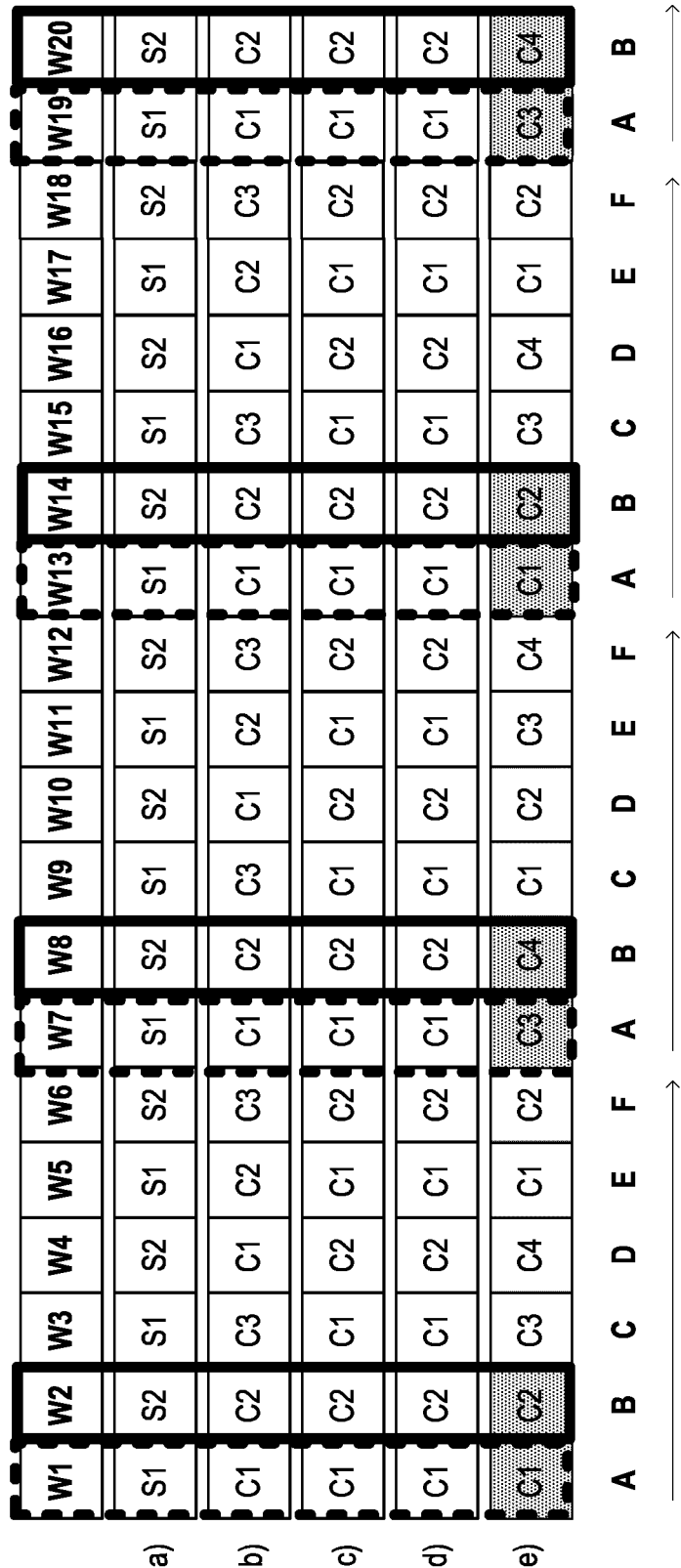
FIG. 6 depicts the table of FIG. 4, highlighting a second method of isolating individual fingerprint contributions from individual processing stations.

FIG. 6 illustrates a slightly different example also illustrating the ability to isolate component fingerprints applicable to individual processing stations. The illustrated sequence is the same as that of FIGS. 4 and 5. Here, the processing stations being isolated relate to the processing apparatus of processing step e). In this example, two different sub-threads are required to isolate the four chambers C1, C2, C3, C4 of this step e). A first processing sub-thread relates to steps a)-d) of substrates W1, W7, W13, W19 (for which step e) alternates between station C1 and station C3) and a second processing sub-thread relates to steps a)-d) of substrates W2, W8, W14, W20 (for which step e) alternates between station C2 and station C4). As such, the fingerprint components relating to processing stations C1 and C3 at step e) can be isolated from the effect of the first processing sub-thread fingerprints by comparing the fingerprint data of substrates W1, W7, W13, W19. Similarly, the fingerprint components relating to processing stations C2 and C4 at step e) can be isolated from the effect of the second processing sub-thread fingerprints by comparing the fingerprint data of substrates W2, W8, W14, W20.

Figure 7:
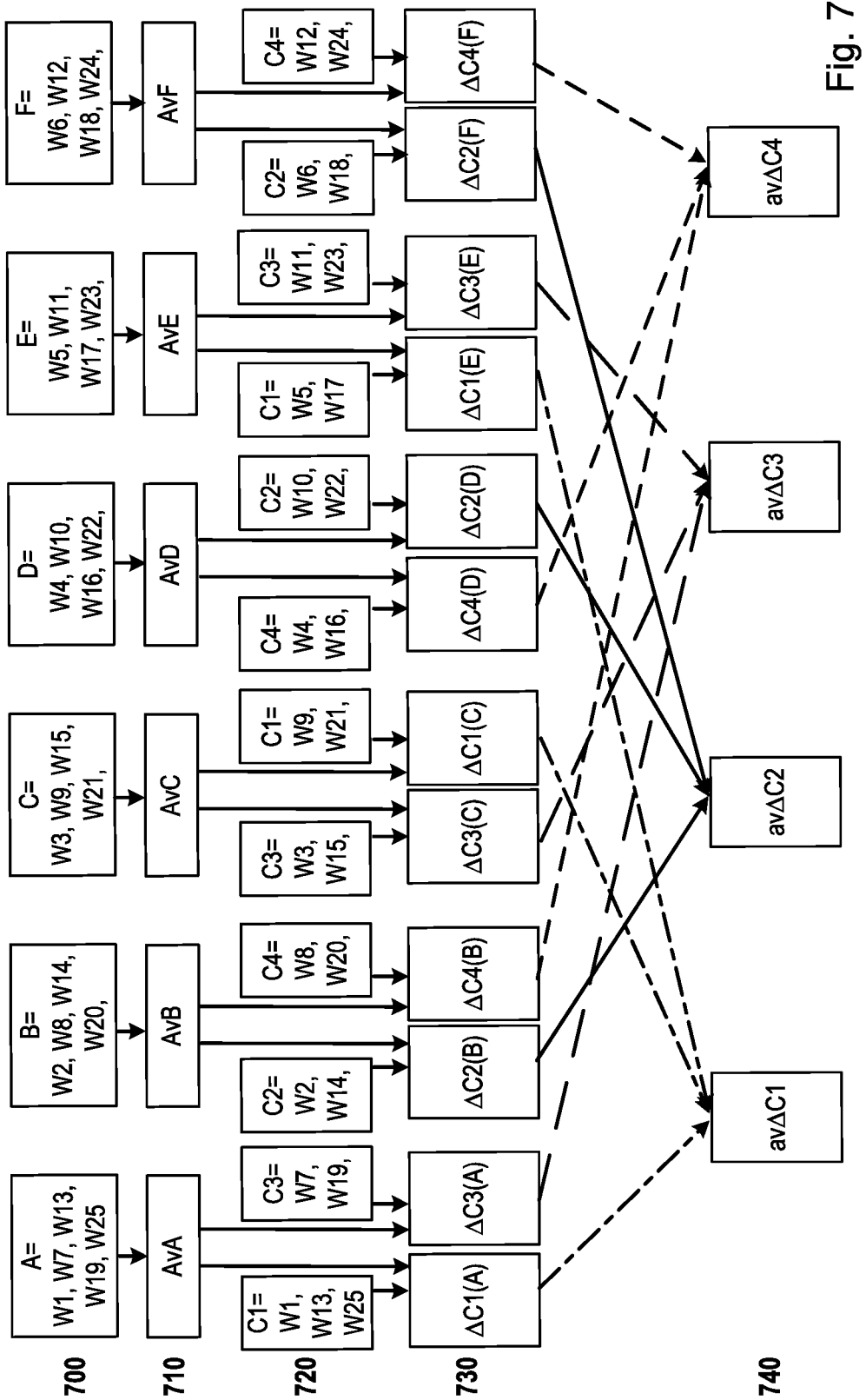
FIG. 7 is a flowchart of a method for determining delta fingerprints for each individual processing station of a processing step, according to an embodiment of the invention.

FIG. 7 generalizes the above by describing a method for labeling processing threads to isolate individual processing station fingerprints. In this specific example, it is the fingerprint components of processing stations C1, C2, C3, C4 of step e) which are each being isolated. At step 700, the substrates are categorized according to process sub-thread; i.e., the processing sub-threads relating to steps a)-d). There are six such categories A-F, which cycle sequentially over the substrates of the lot. For example, category A comprises substrates W1, W7, W13, W19 and W25 (for a 25 substrate lot), category B comprises substrates W2, W8, W14, W20, etc. This categorization is also shown along the bottom of FIG. 6.

At step 710 an average for the fingerprints per different process sub-thread/category A to F is determined to obtain respective average process sub-thread fingerprints AvA to AvF.

At step 730, for each processing station C1-C4 being isolated 720 and each process sub-thread or category A to F (i.e., for each processing thread), a delta fingerprint (difference fingerprint) ΔC1(A), ΔC3(A), ΔC2(B), ΔC4(B), ΔC1(C), ΔC3(C), ΔC2(D), ΔC4(D), ΔC1(E), ΔC3(E), ΔC2(F), ΔC4(F) is determined with respect to the corresponding average process sub-thread fingerprint AvA to AvF for that substrate. This step may comprise determining the difference between a substrate fingerprint (or an average fingerprint for a plurality of substrates all sharing the same full processing thread) 720 and the average AvA to AvF 710 corresponding to that substrate or plurality of substrates.

At step 740, the delta fingerprints determined at step 730 are averaged per processing station, to obtain station specific delta fingerprints avΔC1, avΔC2, avΔC3, avΔC4 for each processing station. This intra-lot data stage may also comprise determining the average overall process fingerprint for the lot, which cannot be decomposed, using present fingerprint decomposition techniques.

The basic methodology described above and in FIG. 7 can then be performed in essentially the same manner to isolate fingerprints for each processing station comprised in the corresponding apparatuses to each respective process step a)-e). In this manner, a fingerprint decomposition is obtained in terms of all processing stations (e.g., chambers and stages/chucks) in a single toolset (set of processing apparatuses) flow corresponding to processing of a lot. To do this, there should be a sufficiently dense measurement of all substrates.

This intra-lot data stage therefore comprises a single lot fingerprint decomposition to determine delta fingerprints per processing station and an average fingerprint for the process. Multiple lots will be subject to different combinations of processing apparatuses. The delta fingerprints per processing station can be used to determine substrate-level feed-forward corrections (wafer level control WLC) for one or more subsequent layers (the correction will be specific for the lot/each substrate), for each individual substrate.

The second stage or inter-lot data stage may comprise performing a fingerprint decomposition per processing apparatus (tool-to-tool fingerprint decomposition), averaged over the processing stations comprised within each processing apparatus, based on metrology performed on multiple lots. This comprises a similar approach as described for the intra-lot data stage, but with respect to average fingerprints per lot, and therefore average fingerprints per processing apparatus.

FIG. 8 shows a table illustrating a purely exemplary inter-lot data stage. The table is similar to that shown in FIGS. 4 to 6, but at a lot level (lots L1 to L20), such that each entry represents a fingerprint for a processing apparatus (averaged over its processing stations). It can be seen that there are no obvious sequence patterns or predictability in the sequence of apparatus allocation for each of process steps a)-e). This is because it can be typically assumed that processing apparatus allocation for each lot is essentially random. The result of this inter-lot data stage may comprise a complete fingerprint set (e.g., for lot-to-lot tool matching and stability control) which numbers the product of the number of processing apparatuses used for each process step a) to e). This is significantly fewer than the product of the number of processing stations used for each process step a) to e).

An example of such a tool matching/stability control action will now be described. Suppose that a processing apparatus fingerprint of processing apparatus e)T3 used for process step e) requires updating because, for example, it has been newly installed or had major maintenance. One approach may comprise scheduling lots (e.g., lots L3, L6, L15, L17 and L20) for metrology which were processed on processing apparatus e)T3. For such an approach to be effective, sufficient lots should be measured to average out the remainder of the lot-level process thread or apparatus process thread (the differences in each of the other tools used for processing the lots); i.e., the lot-level process sub-thread or apparatus process sub-thread. Alternatively, two or more lots that have the same lot-level process sub-thread (i.e., in terms of processing apparatuses) can be identified and used to isolate the fingerprint of apparatus e)T3. In the specific example here lot L3 and L14 could be used to isolate the fingerprint of processing apparatus e)T3. The random nature of tool allocation means it is not always possible to do this, however.

A couple of preliminary steps could be optionally performed to increase efficiency. A determination as to which process steps actually contribute to the final fingerprint could be made, and this determination used to reduce number of process steps considered in the fingerprint decomposition (e.g., so as not to include process steps which do not make a significant contribution to the final fingerprint). Additionally, if an isolated fingerprint is already known, the performance data may be corrected for this isolated fingerprint in advance and its corresponding process step removed from consideration in the fingerprint decomposition. For example, if a tilt fingerprint is determined in an APEI (after partition etch inspection) step and its overlay impact on the AFEI (after final etch inspection) fingerprint can be calculated, then the APEI fingerprint can be removed from the data and the corresponding process from the decomposition.

The hierarchal fingerprint decomposition method described herein enables a context driven, substrate level feedforward correction to a next layer based on per-substrate estimate of the end-performance fingerprint of a previous layer which is determined from the context history of each substrate within a lot. Compared to present fingerprint decomposition methods, metrology in terms of substrates measured can be reduced and/or sampling locations can be increased (distributed sampling), to obtain a fingerprint library. The fingerprint library can be constructed incrementally; for example, an initial fingerprint library is obtained after only the first lot is measured, in terms of the tools/process threads used in that one lot.

The post-processing data may comprise performance data associated with one or more features provided to the substrates during the process step and/or after the process step. Such performance data may, for example, relate to one or more selected from: overlay between layers, overlay between patterns applied by multiple patterning steps in a single layer, focus quality, CD of the one or more features, edge placement error of the one or more features, one or more electrical characteristics of the one or more features, and/or yield of the substrates relating to a relative amount of functioning devices comprising the one or more features.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc. In that regard, the processed "substrates" may be semiconductor wafers, or they may be other substrates, according to the type of product being manufactured.

Although specific reference may be made in this text to embodiments of the invention in the context of a lithographic apparatus, embodiments of the invention may be used in other apparatus. Embodiments of the invention may form part of a patterning device inspection apparatus, a metrology apparatus, or any apparatus that measures or processes an object such as a wafer (or other substrate) or a mask (or other patterning device). These apparatuses may be generally referred to as lithographic tools. Such a lithographic tool may use vacuum conditions or ambient (non-vacuum) conditions.

In the present document, the terms "radiation" and "beam" are used to encompass all types of radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Although specific reference may have been made above to the use of embodiments of the invention in the context of optical lithography, it will be appreciated that the invention, where the context allows, is not limited to optical lithography and may be used in other applications, for example imprint lithography.

The terms "optimizing" and "optimization" as used herein refers to or means adjusting an apparatus (e.g., a lithography apparatus), a process, etc. such that results and/or processes have more desirable characteristics, such as higher accuracy of projection of a design pattern on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, these inventions have been grouped into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the present disclosure to the particular form disclosed, but to the contrary, the intention is to cover all modifications, equivalents, and alternatives falling within the spirit and scope of the inventions as defined by the appended claims.

Modifications and alternative embodiments of various aspects of the inventions will be apparent to those skilled in the art in view of this description. Accordingly, this description and the drawings are to be construed as illustrative only and are for the purpose of teaching those skilled in the art the general manner of carrying out the inventions. It is to be understood that the forms of the inventions shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. References to selection from a range includes the end points of the range.

In the above description, any processes, descriptions or blocks in flowcharts should be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art.

Further embodiments of the invention are described in the list of numbered embodiments below.

1. A method for characterizing post-processing data in terms of individual contributions from processing stations, the post-processing data relating to a manufacturing process for manufacturing integrated circuits on a plurality of substrates in a plurality of process steps using one or more processing apparatuses, at least some of said processing apparatuses each comprising a plurality of said processing stations, said method comprising:

characterizing, in a first stage, only a subset of said post-processing data in terms of individual contributions from processing stations comprised within a proper subset of processing apparatuses, wherein said subset of said post-processing data relates to the manufacturing process performed on a proper subset of said plurality of substrates using the proper subset of the one or more processing apparatuses.

2. A method according to embodiment 1, wherein said proper subset of processing apparatuses comprises only a single respective processing apparatus for each of said processing steps.

3. A method according to embodiment 2, wherein said proper subset of the plurality of substrates comprises a single lot of said plurality of substrates.

4. A method according to embodiment 3, comprising repeating the method for multiple lots to generate a library of said individual contributions.

5. A method according to embodiment 4, comprising varying metrology effort to obtain said post-processing data over the multiple lots.

6. A method according to any of embodiments 2 to 5, wherein, at each process step of said plurality of process steps:

each substrate of said proper subset of the plurality of substrates is processed by one processing station of a processing apparatus corresponding to the process step, each substrate being assigned to a processing station in a cyclic sequence of said processing stations of the processing apparatus corresponding to the process step.

7. A method according to embodiment 6, wherein the combination of processing stations used to process a substrate defines a process thread for said substrate and a decision to perform a metrology action on a particular substrate is made on the basis of a periodicity of a sequence of said process threads for said proper subset of the plurality of substrates.

8. A method according to embodiment 7, wherein no metrology action is scheduled for a substrate which is subject to the same process thread as another substrate in said proper subset of the plurality of substrates for which a metrology action is scheduled.

9. A method according to embodiment 7 or 8, wherein a different sampling scheme is assigned for a metrology action on each of two or more substrates which are subject to the same process thread, of said proper subset of the plurality of substrates.

10. A method according to any of embodiments 2 to 9, wherein a contribution attributable to at least one particular processing station is isolated by comparing said post processing data for substrates of said proper subset of the plurality of substrates which have a processing thread which differs at only the at least one process step corresponding to the at least one processing apparatus of the at least one processing station to be isolated.

11. A method according to embodiment 10, comprising isolating the individual contribution of each processing station of a particular processing step by:

categorizing the substrates according to process sub-thread, wherein process sub-thread relates to the process steps of each process thread other than said particular process step;

determining a process sub-thread average for the post-processing data of the substrates of each process sub-thread category;

determining a difference between the post processing data relating to at least one substrate and the corresponding process sub-thread average for that at least one substrate for each process sub-thread and each processing station of the particular processing step; and averaging said differences for each processing station of the particular processing step.

12. A method according to embodiment 11, comprising performing said steps to isolate the individual contribution of each processing station used for each processing step.

13. A method according to any preceding embodiment, comprising performing a second stage to characterize contributions of said processing apparatuses, wherein each contribution of said processing apparatuses is determined as an average contribution of its constituent processing stations.

14. A method according to embodiment 13, wherein each determined contribution of said processing apparatuses is determined as an average contribution over a plurality of different proper subsets of the plurality of substrates.

15. A method according to embodiment 13 or 14, wherein the combination of processing apparatuses used to process a proper subset of the plurality of substrates defines an apparatus process thread, and a contribution of a particular processing apparatus is isolated by comparing said post processing data for different proper subsets of the plurality of substrates which have an apparatus processing thread which differs at only one process step.

16. A method according to embodiment 13, 14 or 15, wherein the contribution of a particular processing apparatus is isolated by measuring a plurality of said proper subsets of the plurality of substrates, each of which being subject to processing by said particular processing apparatus, and averaging out the effects of the other processing apparatuses used at other processing steps.

17. A method according to any preceding embodiment, wherein said processing apparatuses comprise at least one lithographic exposure apparatus and/or at least one lithographic etching apparatus, and wherein the processing stations of each lithographic exposure apparatus comprise different stages and the processing stations of each etching apparatus comprise different etch chambers.

18. A method according to any preceding embodiment, wherein said post-processing data comprises performance data describing a spatial distribution of at least one performance parameter of said manufacturing process over the substrate.

19. A method according to embodiment 18, wherein a spatial distribution of at least one performance parameter comprises one or more of: an overlay fingerprint, a CD fingerprint, a yield fingerprint, a focus fingerprint, and/or an EPE fingerprint.

20. A method for characterizing post-processing data in terms of individual contributions from processing stations, the post-processing data relating to a manufacturing process for manufacturing integrated circuits on a plurality of substrates using a corresponding processing apparatus for each of a plurality of process steps, at least some of said processing apparatuses each comprising a plurality of said processing stations, and wherein the combination of processing stations used to process each substrate defines a process thread for said substrate; the method comprising:

obtaining post-processing data associated with processing of the plurality of substrates in a cyclic sequence of processing threads; and determining an individual contribution of a particular processing station by comparing a subset of the post-processing data corresponding to substrates having shared process sub-threads, wherein a process sub-thread describes the process steps of each process thread other than the process step to which the particular processing station corresponds.

21. A method according to embodiment 20, comprising averaging individual contributions of a particular processing station over each process sub-thread.

22. A method according to embodiment 21, wherein said averaging step comprises:
determining a difference between post processing data relating to at least one substrate and a corresponding process sub-thread average for that at least one substrate for each process sub-thread and each processing station of the particular processing step; and averaging said differences for each processing station of the particular processing step.

23. A method according to embodiment 22, wherein said step of determining a difference comprises: categorizing the substrates according to process sub-thread, wherein process sub-thread relates to the process steps of each process thread other than said particular process step;
determining a process sub-thread average for the post-processing data of the substrates of each process sub-thread category.

24. A method according to any of embodiments 20 to 23, wherein said plurality of substrates comprises a single lot of said plurality of substrates.

25. A method according to embodiment 24, comprising repeating the method for multiple lots to generate a library of said individual contributions.

26. A method according to embodiment 24 or 25, wherein the post-processing data is obtained by performing metrology actions on one or more substrates comprised within the single or multiple lots.

27. A method according to any of embodiments 20 to 26, wherein, at each process step of said plurality of process steps:
each substrate of the plurality of substrates is processed by one processing station of a processing apparatus corresponding to the process step, each substrate being assigned to a processing station in a cyclic sequence of said processing stations of the processing apparatus corresponding to the process step.

28. A method according to any of embodiments 20 to 27, wherein a decision to perform a metrology action on a particular substrate is made on the basis of a periodicity of a sequence of said process threads for said plurality of substrates.

29. A method according to embodiment 28, wherein no metrology action is scheduled for a substrate which is subject to the same process thread as another substrate in the plurality of substrates for which a metrology action is scheduled.

30. A method according to embodiment 28 or 29, wherein a different sampling scheme is assigned for a metrology action on each of two or more substrates which are subject to the same process thread, of said plurality of substrates.

31. A method according to any of embodiments 20 to 30, comprising performing a further stage to characterize contributions of said processing apparatuses, wherein each contribution of said processing apparatuses is determined as an average contribution of its constituent processing stations.

32. A method according to any of embodiments 20 to 31, wherein said processing apparatuses comprise at least one lithographic exposure apparatus and/or at least one lithographic etching apparatus, and wherein the processing stations of each lithographic exposure apparatus comprise different stages and the processing stations of each etching apparatus comprise different etch chambers.

33. A method according to any of embodiments 20 to 32, wherein said post-processing data comprises performance data describing a spatial distribution of at least one performance parameter of said manufacturing process over the substrate.

34. A method according to embodiment 33, wherein a spatial distribution of at least one performance parameter comprises one or more of: an overlay fingerprint, a CD fingerprint, a yield fingerprint, a focus fingerprint, and/or an EPE fingerprint.

35. A computer program comprising program instructions operable to perform the method of any of embodiments 1 to 34, when run on a suitable apparatus.

36. A non-transient computer program carrier comprising the computer program of embodiment 35.

37. A processing device operable to run the computer program of embodiment 36.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method for characterizing post-processing data in terms of individual contributions from processing stations, the post-processing data relating to a manufacturing process for manufacturing integrated circuits on a plurality of substrates using a corresponding processing apparatus for each of a plurality of process steps, at least some of the processing apparatuses each comprising a plurality of the processing stations, and wherein the combination of processing stations used to process each substrate defines a process thread for the substrate; the method comprising:
obtaining the post-processing data associated with processing of the plurality of substrates in a cyclic sequence of processing threads; and
determining an individual contribution of a particular processing station of the plurality of processing stations by comparing a subset of the post-processing data corresponding to substrates having shared process sub-threads, wherein a process sub-thread describes the process steps of each process thread other than the process step to which the particular processing station corresponds.

2. The method as claimed in claim 1, comprising averaging individual contributions of a particular processing station over each process sub-thread.

3. The method as claimed in claim 2, wherein the averaging comprises:
determining a difference between post processing data relating to at least one substrate and a corresponding process sub-thread average for that at least one substrate for each process sub-thread and each processing station of a particular processing step; and
averaging the differences for each processing station of the particular processing step.

4. The method as claimed in claim 3, wherein the determining a difference comprises:
categorizing the substrates according to process sub-thread, wherein process sub-thread relates to the process steps of each process thread other than the particular processing step; and determining a process sub-thread average for the post-processing data of the substrates of each process sub-thread category.

5. The method as claimed in claim 1, wherein the plurality of substrates comprises a single lot of the plurality of substrates.

6. The method as claimed in claim 5, comprising repeating the method for multiple lots to generate a library of the individual contributions.

7. The method as claimed in claim 5, wherein the post-processing data is obtained by performing metrology actions on one or more substrates comprised within the single lot or within multiple lots of substrates.

8. The method as claimed in claim 1, wherein, at each process step of the plurality of process steps:
each substrate of the plurality of substrates is processed by one of the processing stations of a processing apparatus corresponding to the process step, each substrate being assigned to one of the processing stations in a cyclic sequence of the processing stations of the processing apparatus corresponding to the process step.

9. The method as claimed in claim 1, wherein the post-processing data is obtained by performing metrology actions on one or more substrates and wherein a decision to perform a metrology action on a particular substrate is made on the basis of a periodicity of a sequence of the process threads for the plurality of substrates.

10. The method as claimed in claim 9, wherein no metrology action is scheduled for a substrate which is subject to the same process thread as another substrate in the plurality of substrates for which a metrology action is scheduled.

11. The method as claimed in claim 9, wherein a different sampling scheme is assigned for a metrology action on each of two or more substrates which are subject to the same process thread, of the plurality of substrates.

12. The method as claimed in claim 1, comprising performing a further action to characterize contributions of the processing apparatuses, wherein each contribution of the processing apparatuses is determined as an average contribution of its constituent processing stations.

13. The method as claimed in claim 1, wherein the processing apparatuses comprise at least one lithographic exposure apparatus and/or at least one lithographic etching apparatus, and wherein the processing stations of each lithographic exposure apparatus comprise different stages and the processing stations of each etching apparatus comprise different etch chambers.

14. The method as claimed in claim 1, wherein the post-processing data comprises performance data describing a spatial distribution of at least one performance parameter of the manufacturing process over the substrate.

15. The method as claimed in claim 14, wherein a spatial distribution of at least one performance parameter comprises one or more selected from: an overlay fingerprint, a critical dimension fingerprint, a yield fingerprint, a focus fingerprint, and/or an edge placement error fingerprint.

16. A computer program product comprising a non-transitory computer-readable medium comprising program instructions therein, the instructions, upon execution by a computer system, configured to cause the computer system to at least:
obtain post-processing data in terms of individual contributions from processing stations, the post-processing data relating to a manufacturing process for manufacturing integrated circuits on a plurality of substrates using a corresponding processing apparatus for each of a plurality of process steps, at least some of the processing apparatuses each comprising a plurality of the processing stations, and wherein the combination of processing stations used to process each substrate defines a process thread for the substrate and the post-processing data is associated with processing of the plurality of substrates in a cyclic sequence of processing threads; and
determine an individual contribution of a particular processing station of the plurality of processing stations by comparing a subset of the post-processing data corresponding to substrates having shared process sub-threads, wherein a process sub-thread describes the process steps of each process thread other than the process step to which the particular processing station corresponds.

17. The computer program product of claim 16, wherein the instructions are further configured to cause the computer system to average individual contributions of a particular processing station over each process sub-thread.

18. The computer program product of claim 17, wherein the instructions configured to cause the computer system to average individual contributions are further configured to cause the computer system to:
determine a difference between post processing data relating to at least one substrate and a corresponding process sub-thread average for that at least one substrate for each process sub-thread and each processing station of a particular processing step; and
average the differences for each processing station of the particular processing step.

19. The computer program product of claim 18, wherein the instructions configured to cause the computer system to determine a difference are further configured to cause the computer system to:
categorize the substrates according to their process sub-threads, wherein the process sub-threads relate to the process steps of each process thread other than the particular processing step; and
determine a process sub-thread average for the post-processing data of the substrates of each process sub-thread category.

20. The computer program product of claim 16, wherein the plurality of substrates comprise a single lot of the plurality of substrates.

* * * * *